(12) United States Patent
Melly

(10) Patent No.: US 6,982,584 B2
(45) Date of Patent: Jan. 3, 2006

(54) PHASE QUADRATURE AND SLAVED WORKING FREQUENCY SIGNAL GENERATOR

(75) Inventor: Thierry Melly, Lausanne (CH)

(73) Assignee: CSEM Centre Suisse d'Electronique et de Microtechnique S.A. Recherche et Developpement, Neuchatel (CH)

( * ) Notice: Subject to any disclaimer, the term of this patent is extended or adjusted under 35 U.S.C. 154(b) by 3 days.

(21) Appl. No.: 10/759,530

(22) Filed: Jan. 20, 2004

(65) Prior Publication Data

US 2004/0196084 A1      Oct. 7, 2004

(30) Foreign Application Priority Data

Jan. 21, 2003   (EP) .................................. 03075206

(51) Int. Cl.
    *H03H 11/16* (2006.01)
(52) U.S. Cl. ...................................... 327/254; 327/238
(58) Field of Classification Search ........ 327/231–235, 327/237–238, 240, 252–255, 258, 293, 295
    See application file for complete search history.

(56) References Cited

U.S. PATENT DOCUMENTS

| 5,487,015 A | * | 1/1996 | White ........................ 702/117 |
| 5,644,260 A | | 7/1997 | DaSilva et al. |
| 5,896,053 A | * | 4/1999 | Prentice ........................ 327/255 |
| 5,939,916 A | * | 8/1999 | Jamal et al. ................. 327/231 |
| 6,181,181 B1 | * | 1/2001 | Tsukahara et al. .......... 327/233 |
| 6,211,708 B1 | * | 4/2001 | Klemmer ..................... 327/122 |
| 6,310,502 B1 | * | 10/2001 | Klier ........................ 327/231 |
| 6,314,279 B1 | * | 11/2001 | Mohindra ................... 455/304 |
| 6,369,633 B1 | * | 4/2002 | Tsukahara ................... 327/254 |
| 6,516,186 B1 | * | 2/2003 | Yamagishi et al. ......... 455/302 |
| 6,747,499 B2 | * | 6/2004 | Sanduleanu ................. 327/238 |

FOREIGN PATENT DOCUMENTS

| EP | 837 560 A2 | 4/1998 |
| EP | 1 091 483 A2 | 4/2001 |

* cited by examiner

*Primary Examiner*—Timothy P. Callahan
*Assistant Examiner*—Cassandra Cox
(74) *Attorney, Agent, or Firm*—Sughrue Mion, PLLC

(57) ABSTRACT

An in phase quadrature signal generator including a phase shifter (1) that receives at an input terminal (2) an input signal (Vin) supplied to phase shifting means (3,4) formed of passive elements, arranged for delivering at first and second output terminals, first (Out_I) and second (Out_Q) in phase quadrature signals. This generator is characterised in that it further includes, between the phase shifting means and the output terminals, transconductor means (11, 12) having a transconductance proportional to the passive elements, arranged so as to obtain a transfer function between said first and second in phase quadrature signals independent of said passive elements.

8 Claims, 4 Drawing Sheets

$$f_c = \frac{1}{2\pi \cdot R \cdot C}$$

PHASE QUADRATURE AND SLAVED WORKING FREQUENCY SIGNAL GENERATOR

BACKGROUND OF THE INVENTION

The present invention relates to an in phase quadrature signal generator used particularly in the field of transmissions, for applications such as image frequency rejection receivers or transmitters.

This signal generator includes phase shift means formed of passive elements for delivering in phase quadrature signals from a received input signal.

Such generators, also called I-Q phase shifters (In-phase and Quadrature), are known in the prior art. The general principle is described in FIG. 1 showing a generator whose phase-shifter 1 uses an RC-CR type passive filter stage. An input signal Vin is received at an input terminal 2 of the phase-shifter. This signal Vin is supplied to a first phase-shifter circuit 3 including a resistor R1 connected between the input terminal 2 and a first output terminal 5 of the generator and a capacitor C1 connected between said output terminal 5 and a reference potential, for example to the ground. The signal Vout_I delivered at output terminal 5 of this first phase-shifter circuit 3 is phase shifted with respect to the signal Vin supplied at the input. This signal Vin is supplied in parallel to a second phase shifter circuit 4 including a capacitor C2 connected between the input terminal 2 and a second output terminal 6 of phase shifter 1 and a resistor R2 connected between said second output and the ground. The signal Vout_Q delivered at output terminal 6 is also phase shifted with respect to the signal Vin supplied at the input. Signals Vout_I and Vout_Q are phase shifted by 90° with respect to each other, which is why one speaks of in phase quadrature signals.

Considering the output impedances Z1 and Z2 associated with output terminals 5 and 6, the following equation is obtained as a transfer function between output signals Vout_I and Vout_Q:

$$\frac{Vout\_I}{Vout\_Q} = \frac{1}{j\omega \cdot R2 \cdot C2} \cdot \frac{1 + j\omega \cdot R2 \cdot C2 + \frac{R2}{Z2}}{1 + j\omega \cdot R1 \cdot C1 + \frac{R1}{Z1}}$$

This type of generator is more advantageous when the in phase quadrature signals Vout_I and Vout_Q have the same amplitude. In order to achieve this, the transfer function explained hereinbefore has to have a module with a value of 1.

This type of circuit is integrated in wafers. Passive elements, like resistor or capacitance values, can be matched with an acceptable order of magnitude on the same wafer, of the order of one percent. This order of magnitude varies however, depending on the technology used.

Assuming a perfect match of the resistor values (R1=R2=R), capacitance values (C1=C2=C) and impedance values (Z1=Z2), the transfer function can be simplified as follows:

$$\frac{Vout\_I}{Vout\_Q} = \frac{1}{j\omega \cdot R \cdot C}$$

The amplitudes of the output signals Vout_I and Vout_Q are thus equal for a single frequency $f_0$, also called the cut-off frequency, whose corresponding angular frequency $\omega_0$ has a value of $$\frac{1}{R \cdot C}.$$

However, this type of in phase quadrature signal generator has several drawbacks. Indeed, as mentioned previously, matching of the passive elements of a circuit can only be achieved in an acceptable manner on a same wafer. For such circuits, dispersion between the passive elements from one wafer to another wafer is relatively significant, and can be of the order of ±30% for example for digital CMOS technology.

Thus the frequency $f_0$, which directly depends on the values of these passive elements, varies greatly from one wafer to another, which raises serious problems for applications using a given working frequency.

Moreover, this dispersion represents a major drawback, in particular in application of the image frequency rejection receiver type. Within such applications, filtering means are provided for filtering the whole range of frequencies capable of containing the image frequency in order to retain only that of the signal generated at the working frequency.

Some solutions for avoiding the aforementioned drawbacks have already been proposed in the prior art. A first solution of the prior art consists in using a passive polyphase filter with several stages using different cut-off frequencies. The number of stages and the placing of the poles, defining the different cut-off frequencies, allow the quality of the image frequency rejection to be evaluated as a function of the mismatching of the components and their absolute value. This solution has the drawback of decreasing the amplitude of the signals at the output of each stage.

Another solution according to the prior art consists in making an active polyphase filter. Synthesis of this type of filter requires the use of several transconductors with a high dynamic range. The power consumption and surface area of these filters are significant.

In other applications where the signal amplitude is not significant, since it does not carry data, one can omit the amplitude error by using, for each of the quadrature signals, a large gain amplifier that limits the amplitude, but at the cost of high power consumption.

It will be noted that each of these solutions heavily penalises the circuit's power consumption and that the image frequency rejection remains limited in all cases because of the mismatching of the components used from one wafer to another.

SUMMARY OF THE INVENTION

It is an object of the invention to overcome the aforementioned drawbacks of the prior art, particularly to limit the power consumption of such a circuit and to obtain in phase quadrature signals independent of the passive components of the circuit.

Thus, the invention concerns an in phase quadrature signal generator as defined in the preamble, characterised in that it further includes, between the phase shifter means and the output terminals, transconductor means having a transconductance proportional to the passive elements, arranged so as to obtain a transfer function between said first and second in phase quadrature signals delivered at output, independent of said passive elements.

According to one aspect of the invention, the transconductor means include first and second transconductor circuits that each have temperature independent transconductance so as to obtain a temperature independent transfer function between the in phase quadrature signals.

According to another aspect of the invention, the in phase quadrature signals have the same amplitude at a given frequency and this frequency is dependent on a dynamically modifiable parameter, such as the frequency of a clocked signal.

According to a particular application, the invention also concerns an image frequency rejection receiver including means for receiving external signals at a given frequency, filtering means formed of passive elements, and conversion means including at least two mixers for delivering frequency shifted in phase quadrature signals at a shifted frequency, said receiver being characterised in that it includes transconductor means having a transconductance proportional to the passive elements, arranged so as to obtain a transfer function between the frequency shifted signals, independent of said passive elements.

BRIEF DESCRIPTION OF THE DRAWINGS

The invention will now be explained in detail hereinafter for an embodiment given solely by way of example, this embodiment being illustrated by the annexed drawings, in which.

DETAILED DESCRIPTION OF THE INVENTION

Figure 1:
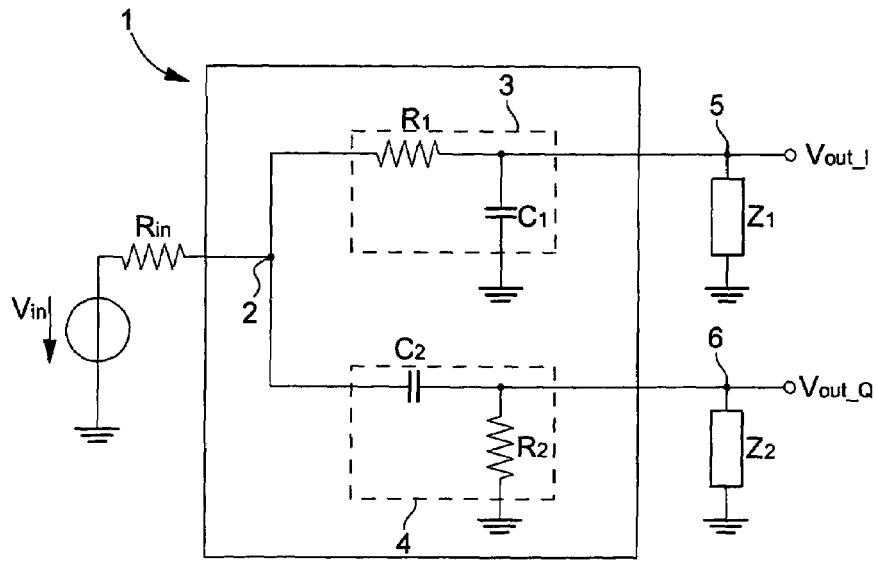
FIG. 1, already described, shows an in phase quadrature signal generator according to the prior art.
Figure 2:
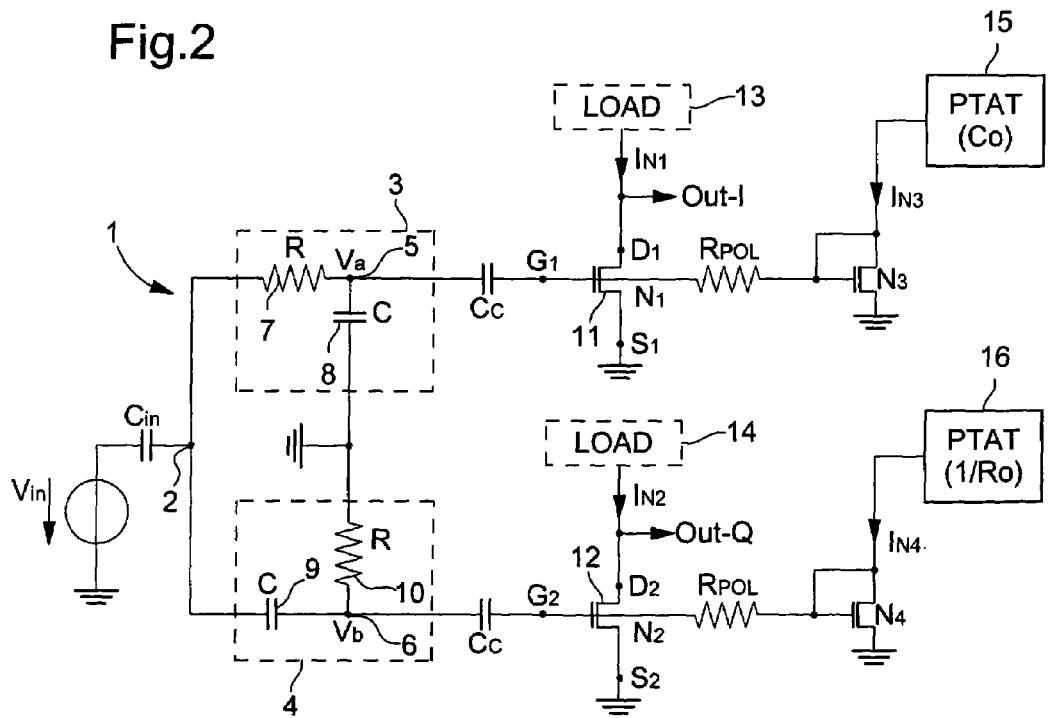
FIG. 2 shows an in phase quadrature signal generator according to a preferred embodiment of the invention.

FIG. 2 shows a block diagram of an in phase quadrature signal generator according to a preferred embodiment of the invention. As in the diagram of the generator of the prior art shown in FIG. 1, there is an input signal Vin supplied to an input terminal 2 of phase shifter 1.

Input terminal 2 is connected to phase shifter means including a first phase shifter circuit 3 and a second phase shifter circuit 4. The phase shifter circuits are formed of passive elements. For example, first phase shifter circuit 3 includes a resistor 7, of value R, connected between input terminal 2 and a first control terminal 5 of the generator and a capacitor 8, of capacitance C, connected between said control terminal 5 and a reference potential, typically the ground, and second phase shifter circuit 4 includes a capacitor 9, of capacitance C matched to that of capacitor 8, connected between input terminal 2 and a second control terminal 6 of the generator and a resistor 10, of value R matched to that of resistor 7, connected between said second control terminal 6 and the ground.

Signals Va and Vb, obtained at control terminals 5 and 6, are phase shifted by 90° with respect to each other. As was already mentioned previously, it is possible to obtain an almost perfect match of the passive elements on a same wafer. Assuming thus a perfect match of values R of resistors 7 and 10, and capacitances C of capacitors 8 and 9, the transfer function between the two control terminals is simplified as follows:

$$\frac{Va}{Vb} = \frac{1}{j\omega \cdot R \cdot C}$$

The idea according to the invention is to obtain a transfer function independent of these passive elements in order to ensure an almost identical working frequency from one wafer to another. In order to do this, the generator further includes transconductor means placed at the output of the phase shifter means.

The transconductor means include a first transconductor circuit 11 having a determined transconductance $gm_1$, and a second transconductor circuit 12 having a determined transconductance $gm_2$. These transconductances are determined so as to remove the passive elements dependence on the transfer function between the two output terminals Out_I and Out_Q. Thus transconductance $gm_1$ is proportional to a capacitance value $C_0$ and transconductance $gm_2$ is proportional to a conductance value $1/R_0$. The values $C_0$ and $R_0$ are matched to the values of passive elements R and C almost perfectly, since all the passive elements are on the same wafer.

The transconductances $gm_1$ and $gm_2$ are respectively in the following forms:

$$gm_1 = \alpha_1 \cdot f_{ck} \cdot C_0$$

$$gm_2 = \alpha_2 / R_0$$

where $\alpha_1$ and $\alpha_2$ each represent a proportionality factor and $f_{ck}$ represents a reference frequency, for example that of a quartz.

According to a particular variant, the first transconductor circuit 11 includes a transistor $N_1$ whose control terminal $G_1$ is connected to the first control terminal 5 via a coupling capacitor Cc whose current terminal $D_1$, which corresponds to the first output terminal, is connected to a load 13, such as for example a resistor, and whose current terminal $S_1$ is connected to the ground. The transconductance of such a transistor $N_1$ is generally given in the following form:

$$gm_1 = I_{N1} \cdot g(IC_1)/(n \cdot U_T)$$

Where $I_{N1}$ is the current applied to current terminal D and $g(IC1)$ represents the standardised transconductance of $N_1$.

It will be noted in particular that this transconductance depends on temperature. In order to make transconductance $gm_1$ temperature independent and proportional to the value of capacitance $C_0$, current $I_{N1}$ has to be in the following form:

$$I_{N1} = \alpha_3 \cdot U_T \cdot f_{ck} \cdot C_0$$

Figure 5A:
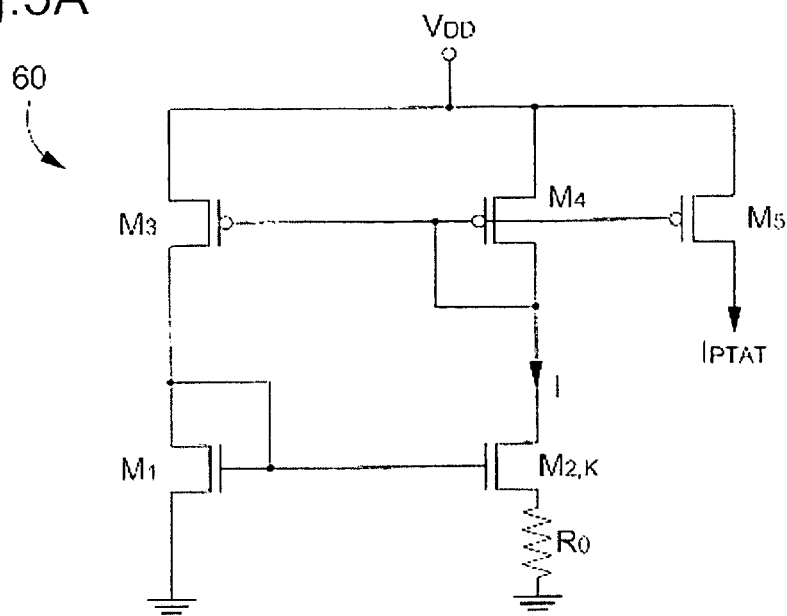
FIGS. 5A and 5B show example embodiments of proportional to absolute temperature (PTAT) current sources.
Figure 5B:
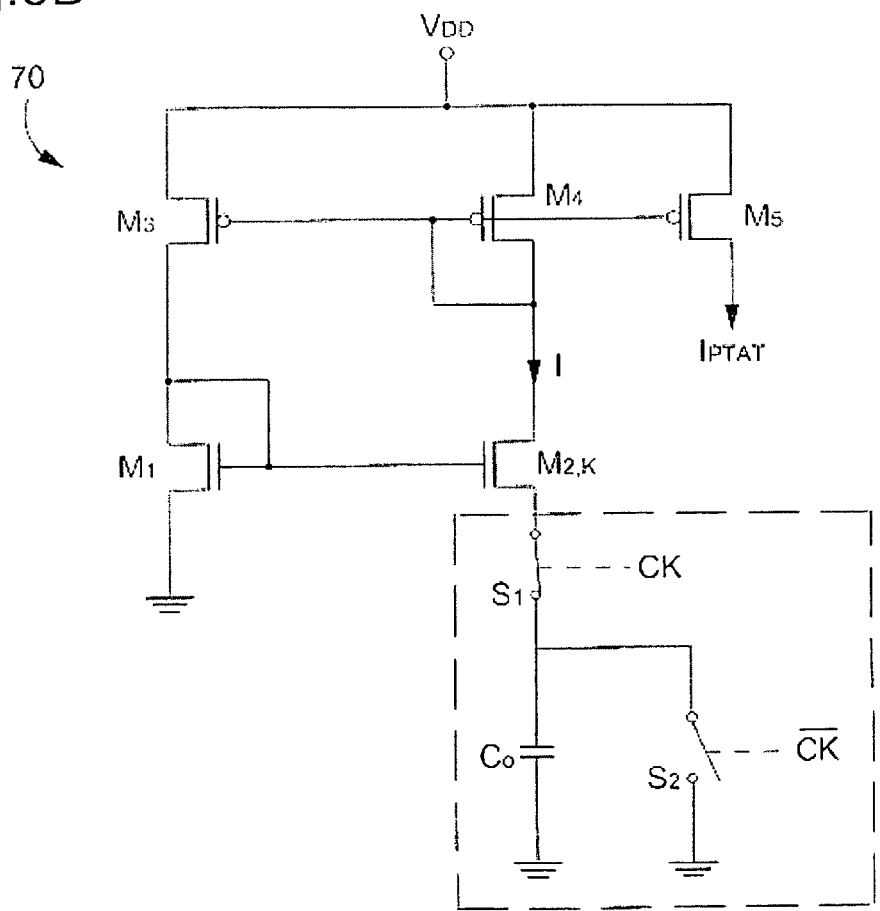

A current is obtained in this form by using a proportional to absolute temperature current source 15, called PTAT, function of the capacitance value $C_0$ and the signal clocked at frequency $f_{ck}$. An example embodiment of such a current source is shown in FIG. 5B. The current $I_{N3}$, delivered by PTAT current source 15, is mirrored by means of a current mirror formed by transistors $N_1$ and $N_3$. It should be noted that the ratio between currents $I_{N1}$ and $I_{N3}$ can be chosen to be equal to 1 or different from 1 depending upon requirements by sizing transistors $N_1$ and $N_3$.

Advantageously, the second transconductor circuit 12 includes a transistor $N_2$ whose control terminal $G_2$ is connected to second control terminal 6 via a coupling capacitor Cc, whose current terminal $D_2$, which corresponds to the second output terminal, is connected to a load 14 identical to load 13 and whose current terminal $S_2$ is connected to the ground.

In order to make transconductance $gm_2$ temperature independent and proportional to the conductance value $1/R_0$, current $I_{N2}$ has to be in the following form:

$$I_{N2} = \frac{\alpha_4 \cdot U_T}{R_0}$$

A current is obtained in this form by using a PTAT type current source a function of the conductance value $1/R_0$. An example embodiment of such a current source is shown in FIG. 5A. Current $I_{N4}$ delivered by PTAT current source 16, is mirrored by means of a current mirror formed by transistors $N_2$ and $N_4$; the ratio between the currents $I_{N2}$ and $I_{N4}$ being selected in accordance with requirements.

Thus, a transfer function is obtained between current terminals $D_1$ and $D_2$ of transconductor circuits 11 and 12 in the following form:

$$\frac{I_{N1}}{I_{N2}} = \frac{f_{ck}}{j\omega} \cdot \frac{C_0 \cdot R_0}{C \cdot R} \cdot \frac{\alpha_3}{\alpha_4}$$

By assuming elements $R_0$ and $C_0$ to be respectively matched to elements R and C and polarising transistors $N_1$ and $N_2$ in weak inversion which causes the dependence of inversion factor g(IC) to disappear, a transfer function is obtained that is independent of temperature and the dispersion of the passive elements of the circuit, i.e. of the product RC in this application example.

It is important to note that the working frequency $f_0$ for which the transfer function module has a value of 1, i.e. for which output signals Out_I and Out_Q have the same amplitude, depends on the frequency $f_{ck}$ of a clocked signal, which is, for example, a clock signal delivered by means of a quartz oscillator. Thus, it is possible to modify the working frequency of the generator in a dynamic manner, by modifying the frequency of the clock signal used.

Figure 3:
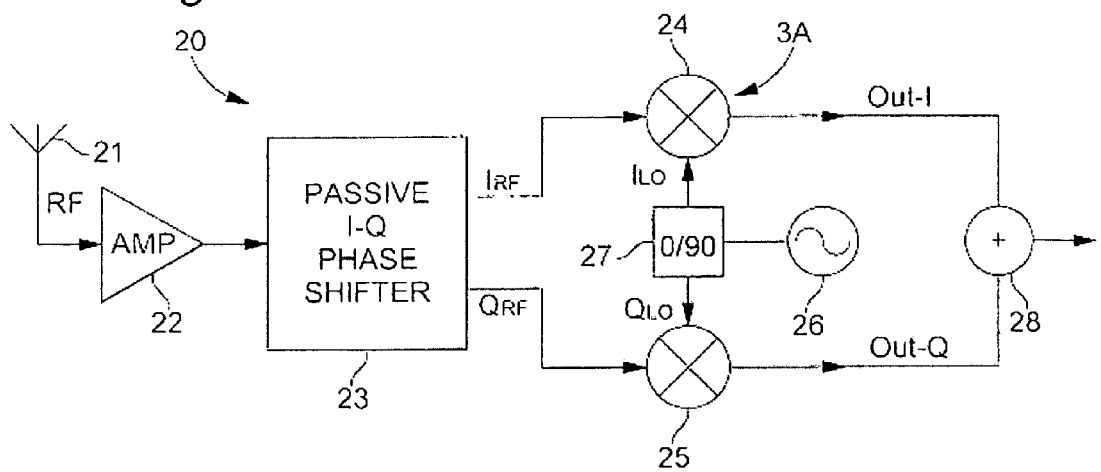
FIG. 3 shows an image frequency rejection receiver integrating an in phase quadrature signal generator according to the invention.
Figure 3A:
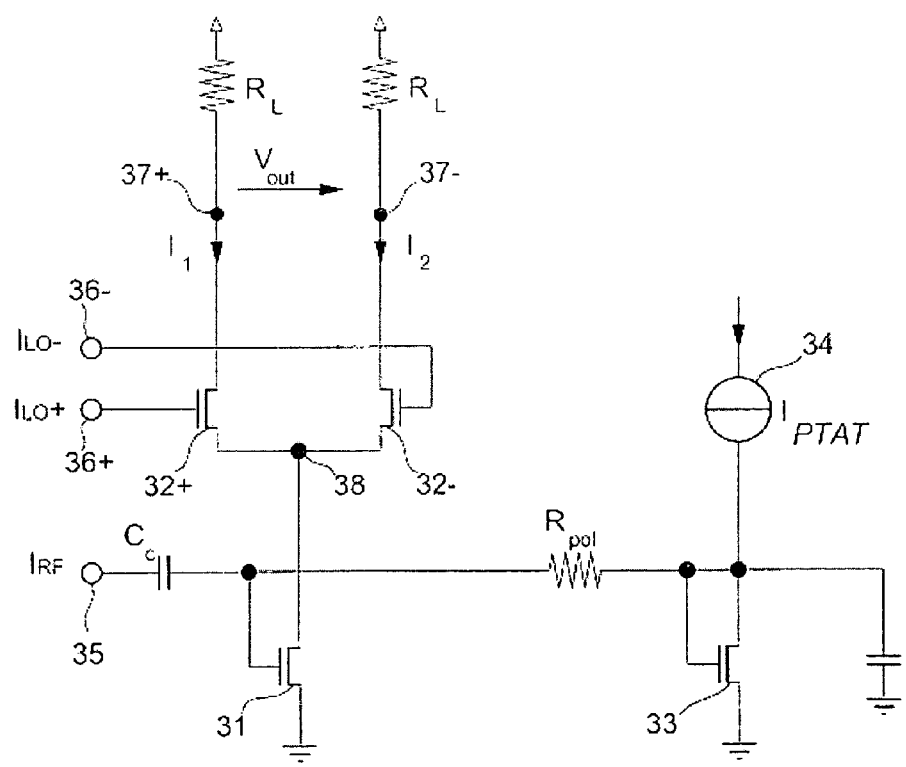
FIG. 3A shows the detail of a mixer used in FIG. 3.

As was mentioned in the introduction, this type of in phase quadrature signal generator can be integrated in an image frequency rejection receiver, as shown in FIGS. 3 and 3A. For the sake of simplicity, the receiver of FIG. 3 is shown with signals in non-differential form. Such a receiver 20 conventionally includes external signal receiving means, like for example a radio-frequency antenna 21, able to be connected to a band-pass filter that is not shown, then to a low noise amplifier 22. The output signal from the low noise amplifier 22 is provided to filtering means, for example to a phase shifter I-Q 23 formed of passive elements for obtaining in phase quadrature signals $I_{RF}$ and $Q_{RF}$. These signals $I_{RF}$ and $Q_{RF}$ are frequency shifted by means of mixers 24 and 25. These mixers can have a structure like that detailed in FIG. 3A, the signals appearing, in this case, in differential form.

As is visible in FIG. 3, each mixer includes two control terminals and an output terminal. Mixer 24 receives signal $I_{RF}$ at one control terminal and an in phase clock signal $I_{LO}$ at the other control terminal, and delivers, at its output terminal, a frequency shifted (RF–LO) in phase signal Out_I. Mixer 25 receives signal $Q_{RF}$ at one control terminal and an in phase quadrature clock signal $Q_{LO}$ at the other control terminal, and delivers at its output terminal an in phase quadrature signal Out_Q that is also frequency shifted (RF–LO).

Clock signals $I_{LO}$ and $Q_{LO}$ are obtained from a local oscillator 26 delivering a clock signal at an adjustable frequency (LO), combined with a 90° phase shifter, referenced 27. It should be noted that it is also possible to use a local oscillator with a double frequency (2LO) combined with a frequency-divider-by 2 stage also for obtaining the desired signals $I_{LO}$ and $Q_{LO}$.

These signals Out_I and Out_Q can then be added by means of a summing amplifier 28 before being processed by a processing unit not shown in FIG. 3.

FIG. 3A shows an example embodiment of mixer 24 of FIG. 3 wherein the signals appear in differential form; since mixer 25 has a similar structure it will not be shown in detail here. As was mentioned hereinbefore, each of these mixers includes a first control terminal 35 receiving a signal $I_{RF}$, a second differential control terminal, 36– and 36+, receiving differential signals $I_{LO-}$ and $I_{LO+}$ and a differential output terminal, 37– and 37+, whose output current is equivalent to the difference in currents $I_1$ and $I_2$. The mixer includes in particular a first transistor 31 whose control terminal 35 receives signal $I_{RF}$, the two current terminals of transistor 31 being respectively connected to the ground and to one of the current terminals 38 of a differential pair of second and third transistors, 32– and 32+, whose control terminals correspond to the differential control terminal, 36– and 36+, of the mixer receiving signals $I_{LO-}$ and $I_{LO+}$. The differential output terminal, 37– and 37+, of the mixer delivering in phase opposition signals Out_I– and Out_I+, is connected, respectively to the other current terminal of the differential pair of transistors 32– and 32+.

The idea according to the invention is to be able to be rid of passive element dispersion when the image frequency (RF+LO) is removed. For this purpose transistor 31 is polarised by means of a current proportional to absolute temperature and to one of the passive elements of phase shifter I-Q 23. This current is obtained, as explained within the scope of FIG. 2, by means of a PTAT current source 34.

The output currents of mixers 24 and 25 are established so as to make the transfer function between output terminals Out_I and Out_Q independent from the passive elements of phase shifters I-Q 23 as was explained hereinbefore.

It will be noted that advantageously, the transistors of the mixers already present in the receiver are used as transconductor means, by adjusting their transconductance so as to be rid of the passive element dispersion.

Figure 4:
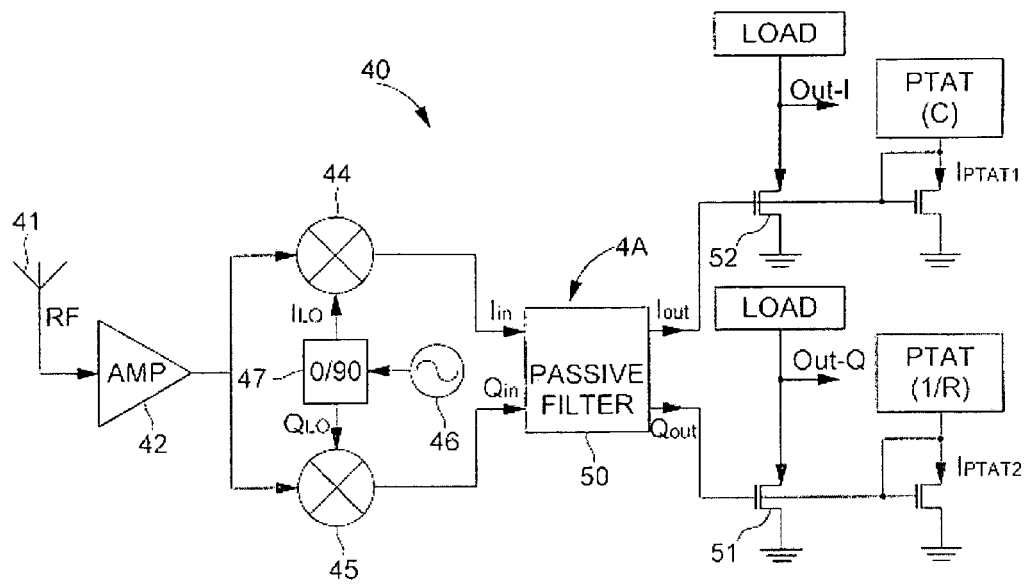
FIG. 4 shows another image frequency rejection receiver.

FIG. 4 shows an image frequency rejection receiver having a different structure to that of the receiver of FIG. 3. Again for the sake of simplicity, the receiver of FIG. 4 is shown with signals in non-differential form. Receiver 40 includes a similar reception stage including external signal reception means like, for example, a radio-frequency antenna 41, able to be connected to a band-pass filter that is not shown, then to a low noise amplifier 42. The RF signal is then supplied at the input of a conventional frequency conversion stage including two mixers 44 and 45 similar to that detailed in FIG. 3A. These two mixers 44 and 45 are respectively controlled by in phase quadrature clock signals $I_{LO}$ and $Q_{LO}$ supplied by a local oscillator 46 in combination with a 90° phase shifter 47, and respectively supply at their output frequency shifted (RF−LO) in phase quadrature signals $I_{IN}$ and $Q_{IN}$.

Figure 4A:
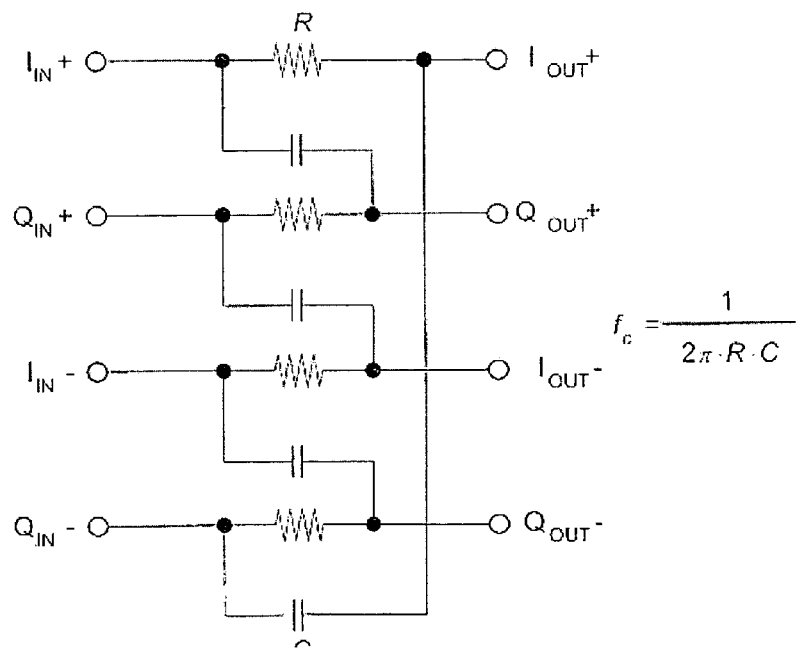
FIG. 4A shows the detail of a passive polyphase filter of FIG. 4.

Signals $I_{IN}$ and $Q_{IN}$ are then filtered in a passive filter 50 like, for example, a passive polyphase filter the detail of which is given in FIG. 4A, the signals appearing, in this case, in differential form. This type of filter will allow, within the matching limit of the passive elements from one receiver to another, the image frequency (RF+LO) of the quadrature signals $I_{OUT}$ and $Q_{OUT}$ delivered at output, to be removed.

FIG. 4A shows an example of a passive polyphase filter, wherein the signals appear in differential form, able to be used for the receiver of FIG. 4.

Four matched resistors R are connected between the terminals, respectively, $I_{IN}+$ and $I_{OUT}+$, $Q_{IN}+$ and $Q_{OUT}+$, $I_{IN}-$ and $I_{OUT-}$ and $Q_{IN}-$ and $Q_{OUT}-$. four matched capacitors C are connected between the terminals, respectively, $I_{IN}+$ and $Q_{OUT}+$, $Q_{IN}+$ and $I_{OUT}-$, $I_{IN}-$ and $Q_{OUT}-$ and $Q_{IN}-$ and $I_{OUT}+$. The cut-off frequency of such a filter is given by the following relation:

$$f_c = 1/(2\pi R.C)$$

In order to be rid of the passive element dispersion, transconductor means are provided having a similar transconductance to those presented within the scope of FIG. 2.

It will be noted that for the transconductor means elements that are already present are advantageously used like, for example, transistors operating in amplifier mode.

It should also be noted that the receivers presented hereinbefore (FIGS. 3 and 4) do not take account of any differential nature of the signals for evident reasons of simplification. The invention of course remains applicable with such four-phase signals.

FIG. 5A shows an example embodiment of a current source proportional to absolute temperature (PTAT) and proportional to a conductance value ($1/R_0$).

The PTAT current source 60 includes a first pair of NMOS transistors $M_1$ and $M_2$, a second pair of PMOS transistors $M_3$ and $M_4$, and a PMOS transistor $M_5$ forming a current mirror with transistor $M_4$.

Transistor $M_2$ has a channel width K times greater than that of transistor $M_1$, and an equal length. One of the current terminals of this transistor $M_2$ is connected to the ground via a resistor $R_0$ matched to the resistors used in the passive phase shifter means described hereinbefore. Current I present at the other current terminal of this transistor $M_2$ has the following form:

$$I = \frac{U_T}{R_0} \cdot \ln K$$

Current I is mirrored in the current mirror formed by transistors $M_4$ and $M_5$, which allows an output current $I_{PTAT}$ of the desired form to be obtained:

$$I_{PTAT} = \frac{\alpha \cdot U_T}{R_0}$$

by taking $\alpha = \ln K$.

FIG. 5B shows an example embodiment of a current source proportional to absolute temperature (PTAT) and proportional to a capacitance value ($C_0$).

PTAT current source 70 differs from the current source of FIG. 5A in that resistor $R_0$ is replaced by a capacitor $C_0$ switched by means of two switches $S_1$ and $S_2$ controlled, respectively, by signal CK and $\overline{CK}$ and directly linked to the clock signal frequency $f_{ck}$.

Current I present at the other current terminal of transistor $M_2$ is then in the following form:

$$I = U_T . f_{ck} . C_0 . \ln K$$

Current I is mirrored in the current mirror formed by transistors $M_4$ and $M_5$, which allows an output current $I_{PTAT}$ of the desired form to be obtained:

$$I_{PTAT} \alpha . U_T . f_{ck} . C_0$$

by taking $\alpha = \ln K$.

A capacitor that is not shown can be provided between the current terminals of transistor $M_2$ delivering current I and the ground for the purpose of short-circuiting the high-frequency elements resulting from switching to the ground.

To conclude, it should be noted that if the description mentions the use of MOS transistors, particularly for making the PTAT current sources, it is nonetheless possible to envisage sources that operate similarly made with bipolar transistors.

It will also be noted that the embodiments presented in FIGS. 2, 3 and 4, are given solely by way of example, and particularly that the PTAT current sources can be substituted by any means for polarising the transconductor means of the circuit so as to obtain a transfer function independent of the passive elements of the circuit and preferably of the temperature.

It will also be noted that integration of an in phase quadrature signal generator according to the invention has been given for a receiver, but that it is entirely possible to integrate it in an image frequency rejection transmitter.

It is clear that the description is given solely by way of example and that other embodiments, particularly of the phase shifter or passive filtering means, can form the subject of the present invention.

What is claimed is:

1. In a phase quadrature signal generator including a phase shifter receiving at an input terminal an input signal supplied to phase shifting means formed of passive elements, arranged for delivering at first and second output terminals, first and second in phase quadrature signals, wherein it further includes, between the phase shifting means and the output terminals, transconductor means having a transconductance proportional to the passive elements, arranged so as to obtain a transfer function between said first and second in phase quadrature signals independent of said passive elements, wherein said phase shifting means include:
a first phase shifter circuit including a first resistor connected between the input terminal and a first output of the phase shifting means and a first capacitor connected between the first output of the phase shifting means and a reference potential,
a second phase shifter circuit including a second capacitor, matched to said first capacitor, connected between the input terminal and a second output of the phase shifting means and a second resistor, matched to said first resistor, connected between the second output of the phase shifting means and said reference potential and wherein said transconductor means include
- a first transconductor circuit having a first determined transconductance proportional to a capacitance matched to the capacitance of said first and second capacitors, and
- a second transconductor circuit having a second determined transconductance proportional to a conductance matched with said first and second resistors.

2. In phase quadrature signal generator according to claim 1, wherein said first and second transconductance are temperature independent so as to obtain a temperature independent transfer function between said first and second in phase quadrature signals.

3. In phase quadrature signal generator according to claim 2, wherein said first and second transconductances are determined respectively by means of a first current source proportional to absolute temperature and to the capacitance value and a second current source proportional to absolute temperature and to the conductance value.

4. In phase quadrature signal generator according to claim 1, wherein said in phase quadrature signals have the same amplitude at a given frequency, and wherein said frequency is dependent upon a dynamically modifiable parameter.

5. In phase quadrature signal generator according to claim 4, wherein said modifiable parameter corresponds to the frequency of a clocked signal.

6. Image frequency rejection receiver including
- means for receiving external signals at a given frequency,
- filtering means formed of passive elements, and
- conversion means including at least two mixers for delivering frequency shifted in phase quadrature signals at a frequency, wherein it includes transconductor means having a transconductance proportional to the passive elements, arranged so as to obtain a transfer function between the frequency shifted signals independent of said passive elements.

7. Receiver according to claim 6, wherein the filtering means include a passive phase shifter I-Q placed between the reception means and the conversion means and wherein the transconductor means include a first transistor of the first mixer and a second transistor of the second mixer.

8. Receiver according to claim 7, wherein the filtering means include a passive polyphase filter with at least one stage, and wherein the transconductor means include two transistors in amplifier mode.

* * * * *